United States Patent
Akutsu

(10) Patent No.: US 10,026,709 B2
(45) Date of Patent: Jul. 17, 2018

(54) ANISOTROPIC ELECTRICALLY CONDUCTIVE FILM

(71) Applicant: DEXERIALS CORPORATION, Tokyo (JP)

(72) Inventor: Yasushi Akutsu, Utsunomiya (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 15/523,438

(22) PCT Filed: Nov. 17, 2015

(86) PCT No.: PCT/JP2015/082221
§ 371 (c)(1),
(2) Date: May 1, 2017

(87) PCT Pub. No.: WO2016/080379
PCT Pub. Date: May 26, 2016

(65) Prior Publication Data
US 2017/0317047 A1    Nov. 2, 2017

(30) Foreign Application Priority Data
Nov. 17, 2014  (JP) .................................. 2014-232934

(51) Int. Cl.
*H01L 23/00*  (2006.01)
(52) U.S. Cl.
CPC .............. *H01L 24/32* (2013.01); *H01L 24/83* (2013.01); *H01L 2224/29082* (2013.01);
(Continued)
(58) Field of Classification Search
CPC ............ H05K 3/32; H05K 3/40; H05K 3/323; H05K 1/11; H05K 1/181; H05K 3/303;
(Continued)

(56) References Cited

U.S. PATENT DOCUMENTS 7,635,889 B2 * 12/2009 Isa ..................... H01L 21/288
257/249
8,487,436 B2 * 7/2013 Isa ..................... H01L 51/0022
257/741
(Continued)

FOREIGN PATENT DOCUMENTS

JP    H05-013119 A    1/1993
JP    2003-286457 A   10/2003
(Continued)

OTHER PUBLICATIONS

Mar. 21, 2017 English Translation of the International Preliminary Report on Patentability issued in Patent Application No. PCT/JP2015/082221.
(Continued)

*Primary Examiner* — Alexander Oscar Williams
(74) *Attorney, Agent, or Firm* — Oliff PLC

(57) ABSTRACT

An anisotropic electrically conductive film has a structure wherein the electrically conductive particles are disposed on or near the surface of an electrically insulating adhesive base layer, or a structure wherein an electrically insulating adhesive base layer and an electrically insulating adhesive cover layer are laminated together and the electrically conductive particles are disposed near the interface therebetween. Electrically conductive particle groups configured from two or more electrically conductive particles are disposed in a lattice point region of a planar lattice pattern. A preferred lattice point region is a circle centered on a lattice point. A radius of the circle is not less than two times and not more than seven times the average particle diameter of the electrically conductive particles.

18 Claims, 6 Drawing Sheets

(52) U.S. Cl.
CPC ............... *H01L 2224/29499* (2013.01); *H01L 2224/32225* (2013.01); *H01L 2224/83203* (2013.01); *H01L 2224/83851* (2013.01)

(58) Field of Classification Search
CPC ....... H05K 3/4007; H05K 2201/10166; H05K 2203/04; H05K 2203/066; H05K 2201/0221; H01L 24/32; H01L 2224/83851; H01L 2224/83203; H01L 24/83; H01L 2224/29499; H01L 2224/29082; H01L 2224/32225; H01L 23/00
USPC ............ 257/783; 361/760; 156/237; 29/840; 428/327
See application file for complete search history.

(56) References Cited

U.S. PATENT DOCUMENTS

| | | | | |
|---|---|---|---|---|
| 8,575,751 | B2* | 11/2013 | Sakurai | G03F 7/0037 257/737 |
| 2008/0116385 | A1* | 5/2008 | Yuuya | H01L 27/14676 250/370.08 |
| 2011/0311790 | A1* | 12/2011 | Okada | C09J 9/02 428/209 |
| 2015/0243626 | A1* | 8/2015 | Sato | B32B 7/12 428/166 |
| 2015/0319867 | A1* | 11/2015 | Sato | H05K 3/323 361/760 |
| 2016/0149366 | A1* | 5/2016 | Akutsu | C09J 9/02 156/302 |
| 2016/0280969 | A1* | 9/2016 | Akutsu | C09J 9/02 |
| 2016/0351532 | A1* | 12/2016 | Akutsu | H05K 1/0269 |
| 2017/0207190 | A1* | 7/2017 | Tsukao | H01L 24/73 |
| 2017/0226387 | A1* | 8/2017 | Shinohara | C09J 9/02 |
| 2017/0278820 | A1* | 9/2017 | Shinohara | H01L 24/29 |

FOREIGN PATENT DOCUMENTS

| | | | |
|---|---|---|---|
| JP | 2003286457 A | * | 10/2003 |
| JP | 2010-033793 A | | 2/2010 |
| WO | 2005/054388 A1 | | 6/2005 |
| WO | 2014/034741 A1 | | 3/2014 |
| WO | 2014034741 A1 | * | 3/2014 |
| WO | 2016080379 A1 | * | 5/2016 |

OTHER PUBLICATIONS

Jan. 19, 2016 International Search Report issued in Patent Application No. PCT/JP2015/082221.
Nov. 15, 2016 Written Opinion of the International Preliminary Examining Authority issued in Patent Application No. PCT/JP2015/082221.
Jan. 19, 2016 Written Opinion of the International Searching Authority issued in Patent Application No. PCT/JP2015/082221.

* cited by examiner

ANISOTROPIC ELECTRICALLY CONDUCTIVE FILM

TECHNICAL FIELD

The present invention relates to an anisotropic electrically conductive film.

BACKGROUND ART

An anisotropic electrically conductive film having electrically conductive particles dispersed in an electrically insulating resin binder is widely used for mounting electronic components such as IC chips on a wiring board and the like. However, in such an anisotropic electrically conductive film, it is known that the electrically conductive particles are present in a state of being connected or aggregated with each other. Therefore, in the case where the anisotropic electrically conductive film is applied to the connection between the terminals of the wiring board and the terminals of the IC chip having narrowed pitches upon miniaturizing and reducing the weight of electronic devices, a short circuit may occur between the adjacent terminals due to the electrically conductive particles present in a state of being connected or aggregated in the anisotropic electrically conductive film.

Conventionally, a film, in which electrically conductive particles are regularly arranged, is proposed as an anisotropic electrically conductive film adapted to such a narrow pitch. For example, an anisotropic electrically conductive film obtained as follows has been proposed: An adhesive layer is formed on a stretchable film and the electrically conductive particles are densely filled in a single layer on the surface of the adhesive layer. The film is then biaxially stretched until the distance between the electrically conductive particles becomes a predetermined distance to arrange the electrically conductive particles regularly. Then, an electrically insulating adhesive base layer, which is a constituent element of the anisotropic electrically conductive film, is pressed against the electrically conductive particles, and the electrically conductive particles are transferred to the electrically insulating adhesive base layer (Patent Literature 1). Alternatively, the anisotropic electrically conductive film obtained as follows has also been proposed: Electrically conductive particles are dispersed on a concave portion forming surface of the transfer mold having a concave portion on its surface. The concave portion forming surface is then squeezed to hold the electrically conductive particles in the concave portion, and the adhesive film formed with the adhesive layer for transferring is pressed thereon from above to primarily transfer electrically conductive particles to the adhesive layer. Next, an electrically insulating adhesive base layer, which is a constituent element of the anisotropic electrically conductive film, is pressed against the electrically conductive particles deposited on the adhesive layer, and the electrically conductive particles are transferred to the electrically insulating adhesive base layer (Patent Literature 2). In these anisotropic electrically conductive films, generally, an electrically insulating adhesive cover layer is laminated on the surface of the electrically conductive particle side to cover the electrically conductive particles.

CITATION LIST

Patent Literature

Patent Literature 1: WO 2005/054388
Patent Literature 2: Japanese Unexamined Patent Application Publication No. 2010-033793A

SUMMARY OF INVENTION

Technical Problem

However, the electrically conductive particles tend to aggregate due to static electricity or the like to form secondary particles; thus, it is difficult for the electrically conductive particles to be present isolated all the time as primary particles. Therefore, the following problems arise in the techniques of Patent Literatures 1 and 2. That is, in the case of Patent Literature 1, there was a problem that it is difficult to densely pack electrically conductive particles on the entire surface of the stretchable film in a single layer with no defects; thus, the electrically conductive particles may be packed in the stretchable film in an aggregated state, thereby causing a short circuit; or a region, in which no electrically conductive particles are packed (so-called "loss") may be created, thereby causing a poor conduction. In the case of Patent Literature 2, there was a problem that if the concave portion of the transfer mold is covered with electrically conductive particles having a large particle diameter, the electrically conductive particles are removed by a subsequent squeegee, a concave portion that does not hold the electrically conductive particles may be created, and "loss" of electrically conductive particles" may occur in the anisotropic electrically conductive film causing a poor conduction; Or, conversely, if a large number of small electrically conductive particles are pressed in the concave portion and transferred to the electrically insulating adhesive base layer, an aggregation of the electrically conductive particles may occur, and further, the electrically conductive particles located on the bottom side of the concave portion may not be in contact with the electrically insulating adhesive base layer; and thus, the electrically conductive particles may be dispersed on the surface of the electrically insulating adhesive base layer, resulting in a loss of a regular arrangement, causing a short circuit and a poor conduction.

An object of the present invention is to overcome the above-mentioned problems in the prior art, and to provide an anisotropic electrically conductive film which is free of problems such as "loss" or "aggregation" of electrically conductive particles that should be arranged in a regular pattern and in which occurrences of a short circuit or a poor conduction are significantly suppressed.

Solution to Problem

The present inventors have found that the object described above can be achieved by disposing the electrically conductive particle groups composed of a plurality of electrically conductive particles in a lattice point region of a planar lattice pattern when disposing electrically conductive particles in a lattice point of a planar lattice. Thus, the present invention was accomplished based on these findings. Furthermore, the present inventors also found that such an anisotropic electrically conductive film can be produced by transferring and depositing a plurality of electrically conductive particles on a tip of the concave portion of the transfer body, which has a concave portion formed on its surface, instead of disposing the electrically conductive particles in the concave portion of the transfer body. Thus, a production method of the present invention was accomplished based on these findings.

That is, the present invention provides an anisotropic electrically conductive film having a structure, in which electrically conductive particles are disposed on or near the surface of an electrically insulating adhesive base layer, wherein an electrically conductive particle group is configured from two or more electrically conductive particles, and the electrically conductive particle group is disposed in a lattice point region of a planar lattice pattern.

In addition, the present invention provides an anisotropic electrically conductive film having a structure, in which an electrically insulating adhesive base layer and an electrically insulating adhesive cover layer are laminated together and electrically conductive particles are disposed near the interface therebetween, wherein an electrically conductive particle group is configured from two or more electrically conductive particles, and the electrically conductive particle group is disposed in a lattice point region of a planar lattice pattern.

The present invention also provides a method of producing an anisotropic electrically conductive film having a structure, in which electrically conductive particles are disposed on or near the surface of the electrically insulating adhesive base layer, comprising the following steps (i) to (iv):

step (i)

preparing a transfer body having a convex portion corresponding to a lattice point region of a planar lattice pattern, formed on the surface thereof;

step (ii)

forming two or more slightly adhesive portions on the top surface of the convex portion of the transfer body;

step (iii)

depositing electrically conductive particles on the slightly adhesive portion of the convex portion of the transfer body; and step (iv)

transferring the electrically conductive particle to the electrically insulating adhesive base layer by overlapping and pressing the electrically insulating adhesive base layer on the surface of the transfer body on the side on which the electrically conductive particles are deposited. Note that, in step (iv), the transferred electrically conductive particles may be further pushed into the electrically insulating adhesive base layer 11.

The present invention also provides a method of producing an anisotropic electrically conductive film having a structure, in which the electrically insulating adhesive base layer and the electrically insulating adhesive cover layer are laminated together and the electrically conductive particles are disposed near the interface therebetween, comprising the following steps (i) to (v):

step (i)

preparing a transfer body having a convex portion corresponding to a lattice point region of a planar lattice pattern, formed on the surface thereof;

step (ii)

forming two or more slightly adhesive portions on the top surface of the convex portion of the transfer body;

step (iii)

depositing electrically conductive particle on the slightly adhesive portions of the convex portion of the transfer body;

step (iv)

transferring the electrically conductive particle to the electrically insulating adhesive base layer by overlapping and pressing the electrically insulating adhesive base layer on the surface at a side of the transfer body on which the electrically conductive particles are deposited; and step (v)

laminating an electrically insulating adhesive cover layer to the electrically insulating adhesive base layer, on which the electrically conductive particles are transferred, from the side, on which the electrically conductive particles are transferred.

Furthermore, the present invention provides a connecting structure body, in which a terminal of a first electronic component and a terminal of a second electronic component are anisotropically electrically conductively connected by the anisotropic electrically conductive film of the present invention.

Advantageous Effects of Invention

In the anisotropic electrically conductive film of the present invention, two or more electrically conductive particles are grouped together to configure electrically conductive particle groups, and a large number of electrically conductive particle groups are disposed in a lattice point region of a planar lattice pattern. Therefore, application of anisotropic electrically conductive film of the present invention to the anisotropic electrically conductive connection can achieve satisfactory initial conductivity and conduction reliability after aging, and can suppress the occurrences of short circuit.

Further, in a method of producing an anisotropic electrically conductive film of the present invention, a transfer body is used that has a convex portion corresponding to a lattice point region of a planar lattice pattern, formed on the surface thereof, and at least two slightly adhesive portions are formed on the top surface of the convex portion of the transfer body. The electrically conductive particles are then deposited on the slightly adhesive portions, and then the electrically conductive particles are transferred to the electrically insulating adhesive base layer. Thus, the electrically conductive particle groups configured from two or more electrically conductive particles are disposed in a lattice point region of a planar lattice pattern. Therefore, use of anisotropic electrically conductive film obtained by the production method of the present invention can achieve anisotropic electrically conductive connection while significantly suppressing occurrences of short circuit and poor conduction between the IC chip and the wiring board having narrow pitches.

DESCRIPTION OF EMBODIMENTS

Hereinafter, the anisotropic electrically conductive film of the present invention will be described in detail with reference to the drawings.

<Anisotropic Electrically Conductive Film>

Figure 1A:
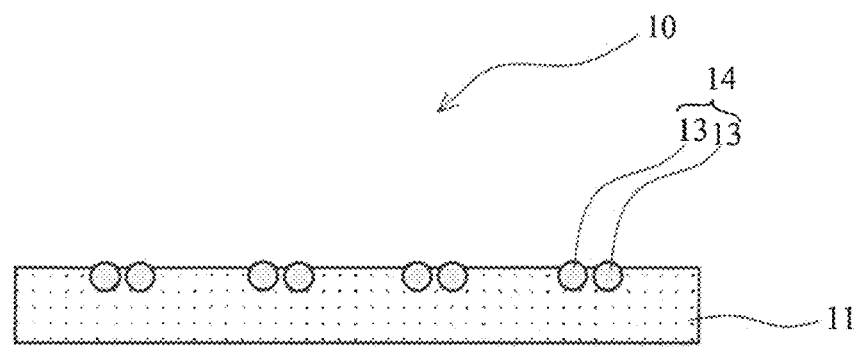
FIG. 1A is a cross-sectional view of an anisotropic electrically conductive film according to an embodiment of the present invention.
Figure 1B:
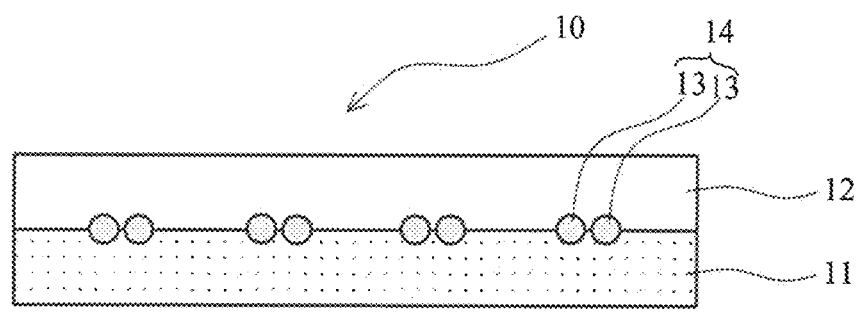
FIG. 1B is a cross-sectional view of the anisotropic electrically conductive film according to an embodiment of the present invention.
Figure 2A:
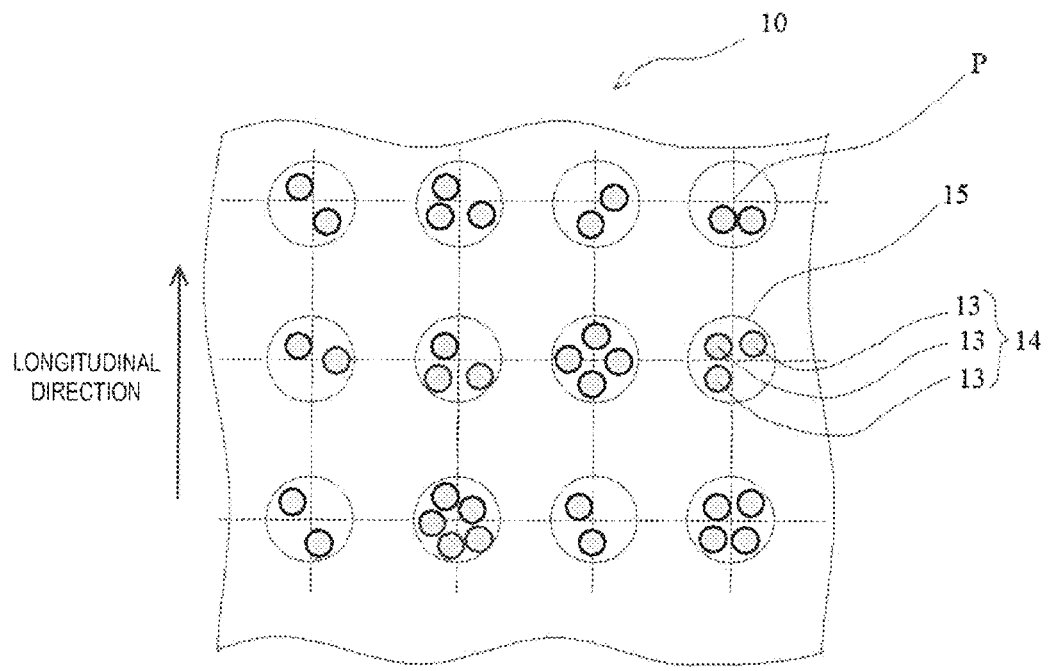
FIG. 2A is a perspective plan view of the anisotropic electrically conductive film according to an embodiment of the present invention.

The anisotropic electrically conductive film according to an embodiment of the present invention is illustrated in FIG. 1A (cross-sectional view) or FIG. 1B (cross-sectional view) and FIG. 2A (perspective plan view). In the case of FIG. 1A, the anisotropic electrically conductive film 10 according to an embodiment of the present invention has a single layer structure, in which electrically conductive particles 13 are disposed on or near the surface of an electrically insulating adhesive base layer 11. Here, "the electrically conductive particles 13 are disposed on the surface of the electrically insulating adhesive base layer 11" means that a part of the electrically conductive particles 13 is pressed and disposed into the electrically insulating adhesive base layer 11, and "the electrically conductive particles are disposed near the surface of the electrically insulating adhesive base layer" means that the electrically conductive particles 13 are completely pressed, embedded and disposed into the electrically insulating adhesive base layer 11. In the case of FIG. 1B, the anisotropic electrically conductive film 10 according to an embodiment of the present invention has a laminated structure, in which the electrically insulating adhesive base layer 11 and the electrically insulating adhesive cover layer 12 are laminated together and the electrically conductive particles 13 are disposed near the interface therebetween. Here, "the electrically conductive particles 13 are disposed near the interface between the electrically insulating adhesive base layer 11 and the electrically insulating adhesive cover layer 12" means that the electrically conductive particles 13 are located at the interface between the two layers, or the electrically conductive particles 13 are completely pressed, embedded and disposed either into the electrically insulating adhesive base layer 11 or into the electrically insulating adhesive cover layer 12.

Furthermore, in the anisotropic electrically conductive film 10 according to an embodiment of the present invention, two or more electrically conductive particles 13 are grouped together to configure electrically conductive particle groups 14, and the electrically conductive particle groups 14 each has a structure disposed in a lattice point region 15 of a planar lattice pattern (dotted line in FIG. 2). In FIGS. 1A, 1B, and 2A, the planar lattice pattern is assumed to run along the longitudinal direction of the anisotropic electrically conductive film 10 and the direction (short-side direction) orthogonal to the longitudinal direction. However, the entire lattice pattern may be assumed to be inclined with respect to both of the longitudinal direction and the short-side direction. With inclined pattern, an effect of improving capturability to bumps can be expected.

(Planar Lattice Pattern)

Examples of the planar lattice pattern assumed for the anisotropic electrically conductive film include a rhombic lattice, a hexagonal lattice, a square lattice, a rectangular lattice, a parallelotope lattice, and the like. In particular, the hexagonal lattice capable of closest packing is preferable.

(Lattice Point Region)

The lattice point region 15 of the planar lattice pattern may be in various shapes, for example, a circular, a triangular, a quadrilateral, a polygonal, or an amorphous-shaped. In particular, from the viewpoint of having similarity with the electrically conductive particles in plan view and easily preventing falling off the electrically conductive particles at the end portions, it is preferable that the center (centroid) of the lattice point region coincides with the lattice point P of the planar lattice pattern, and particularly a circle centered on the lattice point P is preferable.

(Shortest Distance Between Adjacent Lattice Point Regions)

A shortest distance between the adjacent lattice point regions in the planar lattice pattern, i.e., a shortest distance between the centers (centroids) of the adjacent lattice point regions, is preferably twice or greater the average particle diameter of the electrically conductive particles 13 or equivalent to or greater than the size of the lattice point region 15. An upper limit of the shortest distance between the adjacent lattice point regions is appropriately set depending on the bump layout. However, an interval of less than 200 times, more preferably less than 100 times, and even more preferably less than 34 times the average particle diameter of the electrically conductive particles may be provided in the longitudinal direction of the film. This is because the lattice lines may always exist along the bump width direction when the bump width is 200 μm and L/S=1. This is also because, in order to sufficiently capture the electrically conductive particles, two or more lattice lines or three or more lattice lines may exist along the bump width direction (here, these lattice lines need not be parallel to the bump width direction). When there is a plurality of lattice lines, for example, even if the electrically conductive particles are lost so that only one electrically conductive particle exists in the lattice point, the lattice point can be used without any practical problems. This facilitates an increase in yield, thus advantageous in terms of production costs. As long as three or more consecutive lattice points having one electrically conductive particle do not occur in one lattice axis direction, it is possible to resolve this issue by designing the arrangement with a margin and thus, no practical problem arises. Here, when a bump is redundant, for example, in FOG (Film on Glass), the lattice points will be partially contacted; and thus, the shortest distance between the adjacent lattice point regions is more preferably twice or greater and less than 20 times the electrically conductive particle diameter. Within this range, even when the anisotropic electrically conductive film according to an embodiment of the present invention is applied to an anisotropic electrically conductive connection, better initial conductivity (the initial conduction resistance) and conduction reliability after aging may be achieved and occurrences of short circuit may be further suppressed.

(Diameter of Lattice Point Region)

When the lattice point region is circular, a radius thereof is preferably not less than two times and not more than seven times, more preferably not less than two times and not more than five times the average particle diameter of the electrically conductive particle 13. This value can be appropriately set by the bump layout. Within this range, the occurrence of short circuit can be easily prevented that spans across spacing between one bump and the other bump only, and does not span over a plurality of bumps. Furthermore, when a bump or a spacing between bumps is large enough with respect to the electrically conductive particle diameter, the lattice point region may be a rectangular shape where one side is less than 100 times, preferably not greater than 50 times, further preferably not greater than 33 times the particle diameter.

Furthermore, the length of the lattice point region in the longitudinal direction of the film is preferably not greater than half of the bump width. This results in achieving the effect of stability of anisotropic connection and capturing reliability.

(Electrically Conductive Particle Groups)

In an embodiment of the present invention, a reason for configuring the "electrically conductive particle group" 14 from two or more electrically conductive particles 13 is to prevent short circuit by creating a set of electrically conductive particles that do not cross over a plurality of bumps (in other words, creating only a set of electrically conductive particles that cross over only one bump and a spacing between one bump). The number of electrically conductive particles that configure the electrically conductive particle group may differ depending on the average particle diameter of the electrically conductive particle, the lattice point pitch of a planar lattice pattern, or the like, but the number is preferably not less than two and not more than 200. Note that the electrically conductive particles only exist on a single plane, and preferably do not overlap.

Note that if the distance between the lattice points is set to substantially equivalent to the size of the electrically conductive particle group or greater, the electrically conductive particle groups may easily be identified.

(Shortest Distance Between Adjacent Electrically Conductive Particles)

Additionally, a plurality of electrically conductive particles 13 configuring the electrically conductive particle group 14 in the lattice point region 15 may be disposed randomly or disposed regularly. However, a plurality of electrically conductive particles 13 preferably should not make excessive contact with each other. This is to suppress short circuit. In the case where the electrically conductive particles are not in contact with each other, the shortest distance between the adjacent electrically conductive particles is not less than 25% of the average particle diameter of the electrically conductive particle.

Note that in the case where the electrically conductive particles 13 are regularly arranged within the electrically conductive particle groups 14, the number of the electrically conductive particles is preferably not less than 3, more preferably not less than 4. In such a case, the lattice point region including the electrically conductive particle group 14 may be a circle, in which the electrically conductive particles are inscribed. Alternatively, a polygon shape including not less than 3 electrically conductive particles may be a lattice point region. In addition, although not illustrated in the figure, the electrically conductive particles configuring the electrically conductive particle groups may be arranged in a single line at a predetermined distance (preferably not less than 0.5 times the electrically conductive particle diameter), or may be arranged in a manner that two lines cross in an X shape (it may be arranged such that a plurality of lines may intersect each other in a single line). In the case where the direction of an arrangement in a single line is aligned in all the electrically conductive particle groups, there is no line composed of electrically conductive particles at lattice points and no electrically conductive particles in the region without lattice points. However, when viewed macroscopically in plan view, the line composed of electrically conductive particles seems to exist as a dotted line. The arrangement direction may be a longitudinal direction or a short-side direction of the anisotropic electrically conductive film. The arrangement direction may also be a direction intersecting longitudinal or short-side directions. Furthermore, the arrangement direction of the "arrangement in a single line" may be regularly changed.

If the lattice point region of the electrically conductive particle groups composed of three electrically conductive particles is triangular, it is preferable that at least two out of three sides are not parallel either to the longitudinal direction of the anisotropic electrically conductive film or to the short-side direction orthogonal thereto, and more preferably all of the three sides satisfy the above conditions. If the sides of the triangular shape are not parallel to the longitudinal direction, it can be expected that occurrence of short circuit is suppressed, and if the sides of the triangular shape are not parallel to the short-side direction, the electrically conductive particles are not disposed in a straight line at the end of the bump, so it can be expected that variation in the number of captured electrically conductive particles for each bump is suppressed.

Furthermore, the triangular shape of the lattice point region formed by the electrically conductive particle groups composed of three electrically conductive particles may or may not be an equilateral triangle. The triangular shape protruding in the longitudinal direction side or the short-side direction of the anisotropic electrically conductive film is preferred for the following reasons (the triangular shape may be an isosceles triangle because of being easy to understand the arrangement form). If it is a triangle protruding in the longitudinal direction side, the distance in the spacing between the bumps becomes relatively wide, thereby preventing the occurrence of short circuit. Alternatively, if it is a triangle protruding in the short-side direction, the sides of the triangle intersect at an acute angle with respect to the bump end portions; and thus, an effect of being easily captured the electrically conductive particles particularly in the case of fine pitches can be expected.

In this case, it is preferable that circumscribed lines in the film longitudinal direction side of the electrically conductive particles constituting this side exist so as to penetrate the each electrically conductive particle.

The case, in which the lattice point region of the electrically conductive particle group composed of four electrically conductive particles is a quadrilateral shape, may be considered similarly to the case of the triangular shape, because the quadrilateral shape may be considered as a combination of two triangles. Note that the quadrilateral shape may be a square, a rectangle, or a parallelogram, which are configured from two triangles of the identical shape, or may also be a quadrilateral shape such as a trapezoidal shape configured by combining triangles of the different shapes. Alternatively, all of the sides, lengths or angles of the quadrilateral shape may be different. Note that, in the case where the lattice point region of the electrically conductive particle group composed of four electrically conductive particles is a parallelogram, it may be a combination of two equilateral triangles, but it need not be an equilateral triangle. Also in this case, it is preferable that at least two sides are not parallel either to the longitudinal direction of the anisotropic electrically conductive film or to the short-side direction orthogonal thereto for the same reason as in the case of the triangle.

The case, in which the gird point region of the electrically conductive particle group composed of five electrically conductive particles is a pentagonal shape, may be considered similarly to the case of the triangular shape, because the pentagonal shape is a combination of three triangles or a combination of a triangle and a quadrilateral. Even the case, in which the lattice point region of the electrically conductive particle group composed of six or greater electrically conductive particles is a corresponding polygon shape, may be considered similarly to the case of the following polygons, because the polygon shape is a combination of triangles, or a triangle and a quadrilateral or pentagon. Furthermore, the lattice point region may be regarded as a circle (including an ellipse). Electrically conductive particles may exist at the center of the circle. This is because a polygon shape formed by combining triangles may be regarded as a circle.

Figure 2B:
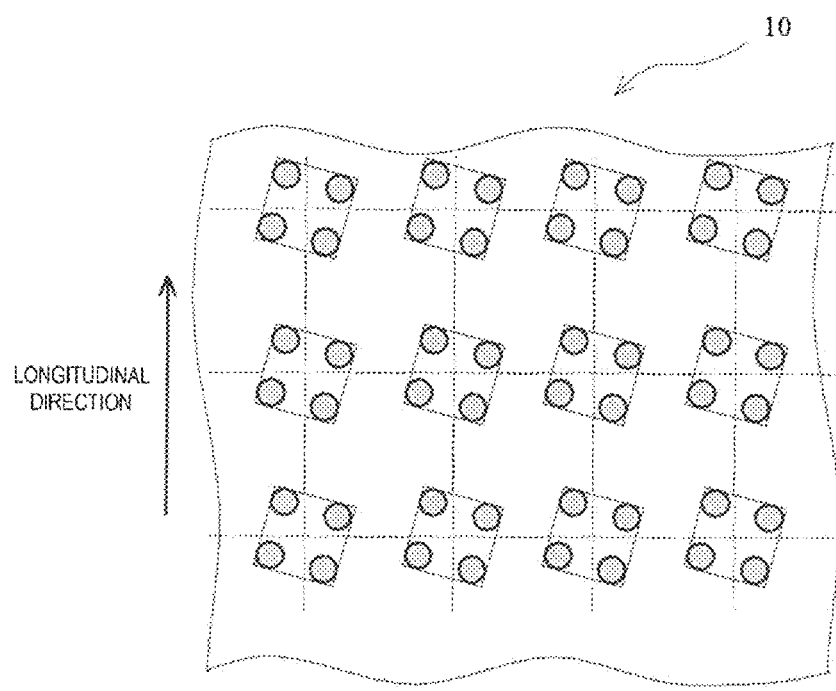
FIG. 2B is a perspective plan view of the anisotropic electrically conductive film according to an embodiment of the present invention.
Figure 2C:
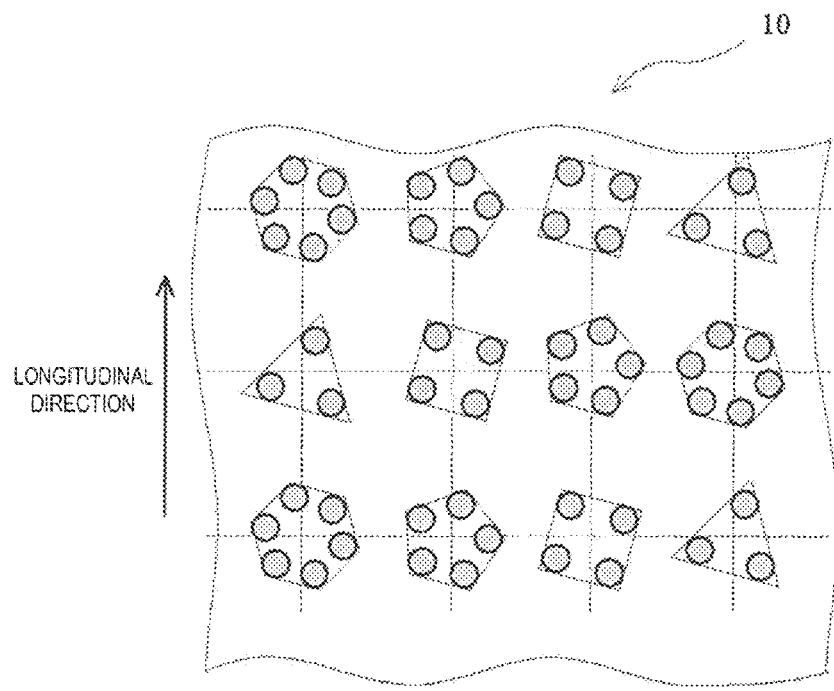
FIG. 2C is a perspective plan view of the anisotropic electrically conductive film according to an embodiment of the present invention.
Figure 2D:
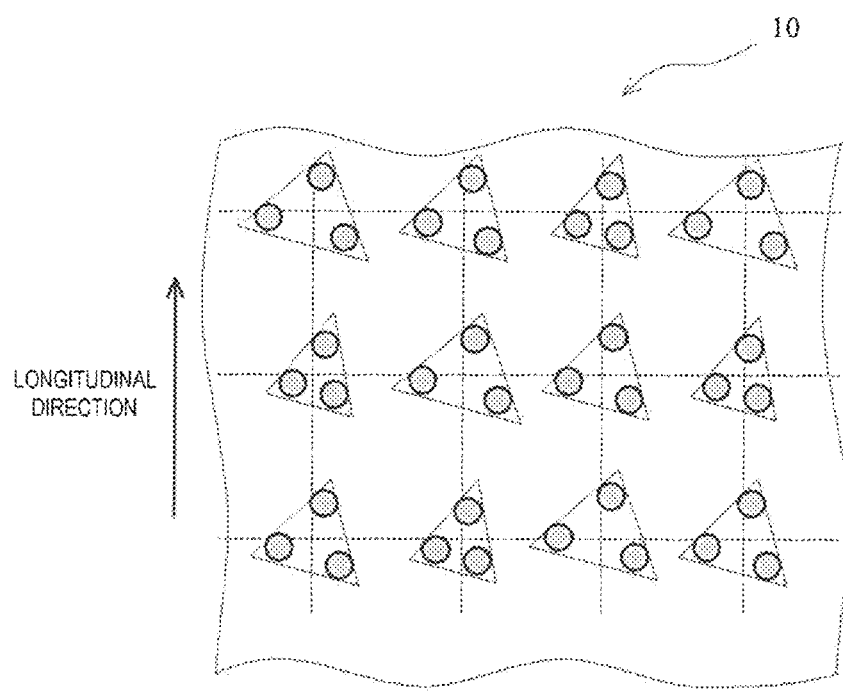
FIG. 2D is a perspective plan view of the anisotropic electrically conductive film according to an embodiment of the present invention.
Figure 2E:
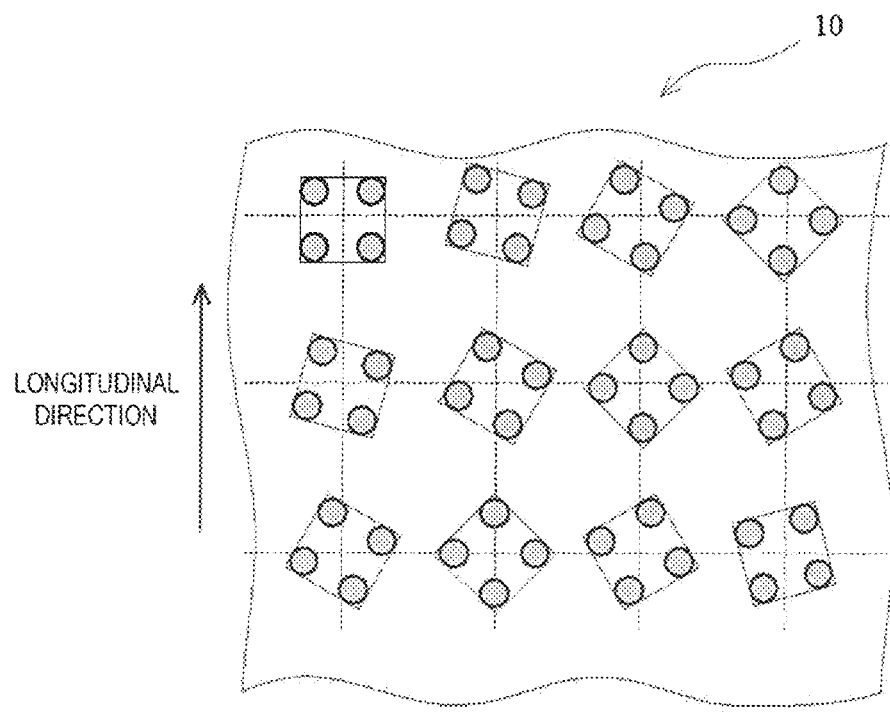
FIG. 2E is a perspective plan view of the anisotropic electrically conductive film according to an embodiment of the present invention.

Note that, as illustrated in FIG. 2B (an embodiment for the case of quadrilateral of a square lattice shape), the regular arrangement of the electrically conductive particles configuring the electrically conductive particle group may be identical in all electrically conductive particle groups. Alternatively, as illustrated in FIG. 2C (an embodiment, in which the number of electrically conductive particles decreases or increases one by one repeatedly within a certain range), may be changed regularly. Alternatively, as illustrated in FIG. 2D (an embodiment, in which a length of a base of an isosceles triangle increases by a constant length), the shape may be regularly changed with the same number of electrically conductive particles. As illustrated in FIG. 2E (an embodiment in which a quadrilateral of the square lattice shape is rotated), the angle relative to the longitudinal direction of the film may be regularly changed, while the regular arrangement is of the same number of electrically conductive particles and the same shape. Note that, the regular arrangement of the electrically conductive particles configuring the electrically conductive particle group is not limited to the embodiments illustrated in these figures, and from the viewpoint of the number of electrically conductive particles, the shape of the electrically conductive particle group, and the like embodiments of various regular changes may be combined. Such a combination can accommodate various modifications not only in the bump layout, but also in compounding of the electrically insulating binder of the anisotropic electrically conductive film, crimping conditions of the anisotropic connection, or the like.

If the regular arrangement changes its arrangement regularly, the side formed of the regular arrangement of the electrically conductive particles configuring the electrically conductive particle group in a part of the lattice points where such a change is present, may include a side parallel to the longitudinal direction of the anisotropic electrically conductive film and the short-side direction orthogonal thereto. The electrically conductive particle groups are arranged in a lattice form; thus, for example, when the longitudinal direction of the bump is large enough compared to the electrically conductive particle group, a plurality of lattice points may exist in the longitudinal direction of the bump. In such a case, the electrically conductive particles existing at the end portions of the bump are captured by any one of the electrically conductive particles at the lattice points. Thus, there is less concern that the conduction resistance becomes unstable because the number of supplements of the electrically conductive particles is decreased. Therefore, by obtaining an arrangement of the electrically conductive particles that can easily grasp the state of the anisotropic electrically conductive film during production or after connection thereof, the accuracy of analyzing factors is improved, thereby facilitating the reduction of total cost. For example, when the film illustrated in FIG. 2D or FIG. 2E is continuously moved in one direction (longitudinal direction which is the winding and unwinding direction of the film, and the direction of the production line when the anisotropic connection is continuously performed), it is easy to detect defects because the manner of change is regular. For example, by scrolling up and down while displaying the FIG. 2E on a display, the movement of the anisotropic electrically conductive film in the actual production line can be simulated. Hence, it is understood that the discrimination between an abnormal state having a discontinuous change and a state having no change can be facilitated in a state where the regular arrangement of the electrically conductive particles continuously changes. As described above, in the present invention, the regular arrangement of the electrically conductive particles configuring the electrically conductive particle group may adopt various forms. This contributes to the method of designing the arrangement of electrically conductive particles in the anisotropic electrically conductive film and becomes a part of the present invention.

(Number of Adjacent Electrically Conductive Particles)

Further, as an index for evaluating the electrically conductive particle group, the number of electrically conductive particles disposed adjacent to the periphery of any electrically conductive particle can be used. Here, "periphery of the electrically conductive particle" means a concentric circle with a radius of 2.5 r that can be drawn on a plane surface of the film, when the electrically conductive particles are assumed to be spheres and their average particle diameter is r.

Further, "adjacent" means a state where the electrically conductive particle is in contact with or at least partially overlaps with the concentric circle. The number of adjacent electrically conductive particles can be measured from the observation result of plan view. The number of adjacent electrically conductive particles is preferably not less than 1 and not more than 14 and more preferably not less than 1 and not more than 10. Setting of such limit is preferred because the shortest distance between bumps in the case of fine pitch is, for example, less than four times the electrically conductive particle diameter. In other words, setting such limit accomplishes both characteristics, i.e., suppresses occurrences of short circuit due to excessive aggregation of the electrically conductive particles, and prevents occurrences of anisotropic connection failure due to excessively loose electrically conductive particles.

(Electrically Conductive Particles)

As the electrically conductive particles 13, a the electrically conductive particles used in a known anisotropic electrically conductive film can be appropriately selected and used. Examples of the electrically conductive particles include metal particles such as nickel, copper, silver, gold, and palladium, and metal-coated resin particles, in which the surface of resin particles such as polyamide and polybenzoguanamine, and the like are coated with metals such as nickel. And the average particle diameter of the electrically conductive particles is preferably not less than 1 m and not greater than 30 μm, and from the viewpoint of handleability during production, preferably not less than 1 μm and not greater than 10 μm, and more preferably not less than 2 μm and not greater than 6 μm. As described above, the average particle diameter can be measured by using an image-type or laser-type particle size analyzer.

The amount of electrically conductive particles to be present in the anisotropic electrically conductive film depends on the lattice point pitch of the planar lattice pattern, the average particle diameter of the electrically conductive particles, and the like, and is generally not less than 300/mm$^2$ and not greater than 40000/mm$^2$.

(Electrically Insulating Adhesive Base Layer)

As the electrically insulating adhesive base layer 11, the layer used as an electrically insulating adhesive base layer in a known anisotropic electrically conductive film can be appropriately selected and used. Examples that can be used include a photoradical polymerizable resin layer containing an acrylate compound and a photoradical polymerization initiator, a thermal radical polymerizable resin layer containing an acrylate compound and a thermal radical polymerization initiator, a thermal cationic polymerizable resin layer containing an epoxy compound and a thermal cationic polymerization initiator, a thermal anionic polymerizable resin layer containing an epoxy compound and a thermal anionic polymerization initiator, and the like, or a curable resin layer thereof. In addition, these resin layers may appropriately contain a silane coupling agent, a pigment, an antioxidant, an ultraviolet absorber, and the like, as necessary.

Note that the electrically insulating adhesive base layer 11 may be formed by forming a film using a coating composition containing a resin as described above by a coating method and then drying, further followed by curing, or by forming a film in advance by a known method.

The thickness of such electrically insulating adhesive base layer 11 may be not less than 1 μm and not greater than 60 μm, preferably not less than 1 μm and not greater than 30 μm, and more preferably not less than 2 μm and not greater than 15 μm.

(Electrically Insulating Adhesive Cover Layer)

As the electrically insulating adhesive cover layer 12, the cover layer used as an electrically insulating adhesive cover layer in a known anisotropic electrically conductive film can be appropriately selected and used. Alternatively, the cover layer formed from the same material as that of the electrically insulating adhesive base layer 11 as described earlier can be also used.

Note that the electrically insulating adhesive cover layer 12 may be formed by forming a film using a coating composition containing a resin as described above by a coating method and then drying, further followed by curing, or by forming a film in advance by a known method.

The thickness of such electrically insulating adhesive cover layer 12 is preferably not less than 1 μm and not greater than 30 μm and more preferably not less than 2 μm and not greater than 15 μm.

Furthermore, electrically insulating filler such as silica fine particles, alumina, and aluminum hydroxide may be added, as necessary, to the electrically insulating adhesive base layer 11 or the electrically insulating adhesive cover layer 12. The amount of the electrically insulating filler blended is preferably not less than 3 and not greater than 40 parts by mass per 100 parts by mass of the resin constituting these layers. With this range of blending amount, even when the anisotropic electrically conductive film 10 is melted during anisotropic electrically conductive connection, unnecessary movement of the electrically conductive particles 13 by the molten resin can be suppressed.

(Laminating Electrically Insulating Adhesive Base Layer and Electrically Insulating Adhesive Cover Layer)

Note that lamination of the electrically insulating adhesive base layer 11 and the electrically insulating adhesive cover layer 12 with the electrically conductive particles 13 being interposed therebetween can be performed by using a known method. In this case, the electrically conductive particles 13 exist near the interface of these layers. Here, "exist near the interface" indicates that a part of the electrically conductive particles intrudes into one layer, the remainder intrudes into the other layer.

<Production of Anisotropic Electrically Conductive Film>

Next, a method of producing an anisotropic electrically conductive film according to an embodiment of the present invention will be described. In other words, the anisotropic electrically conductive film has a structure in which electrically conductive particles are disposed on or near the surface of the electrically insulating adhesive base layer (FIG. 1A), or has a structure in which the electrically insulating adhesive base layer and the electrically insulating adhesive cover layer are laminated together and the electrically conductive particles are disposed near the interface therebetween. Here, the electrically conductive particle groups configured from two or more electrically conductive particles and the electrically conductive particle groups are disposed in a lattice point region of a planar lattice pattern (FIG. 1B). The method of producing an anisotropic electrically conductive film having a structure, in which electrically conductive particles are disposed on or near the surface of the electrically insulating adhesive base layer, comprises the following steps (i) to (iv), and the method of producing an anisotropic electrically conductive film having a structure, in which the electrically insulating adhesive base layer and the electrically insulating adhesive cover layer are laminated together and the electrically conductive particles are disposed near the interface therebetween, comprises the following steps (i) to (v). Each step will be described in detail with reference to the drawings. Note that the present invention is not limited to these production methods.

(Step (i))

Figure 3A:
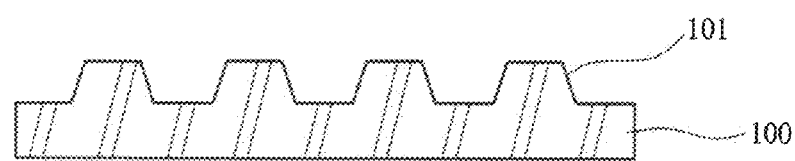
FIG. 3A is a diagram illustrating steps of a production method according to an embodiment of the present invention.

First, as illustrated in FIG. 3A, a transfer body 100, having a convex portion 101 corresponding to the lattice point region of a planar lattice pattern, formed on the surface thereof is prepared. The convex portion 101 may be of various shapes such as a substantially columnar shape, a substantially hemi-spherical shape, a rod shape, and the like. The term "substantially" is used because not only the convex portion may have the same constant width along the height direction, but also the convex portion may have the width, which narrows toward the top. The "substantially columnar shape" herein is a substantially cylindrical shape or substantially prism shape (a triangular prism, a square prism, a hexagonal prism, and the like). The substantially columnar shape is preferable.

The height of the convex portion 101 can be determined depending on the terminal pitch, the terminal width, the spacing width, the average particle diameter of the electrically conductive particles, and the like where anisotropic electrically conductive connection should be provided. And the height is preferably not less than 1.2 times and less than four times the average particle diameter of the electrically conductive particles used. In addition, the half width (width at half height) of the convex portion 101 is preferably not less than two and not greater than seven times, and more preferably not less than two and not greater than five times the average particle diameter of the electrically conductive particles. Setting height and width within the above prescribed range can achieve an effect to prevent the event of shedding or loss of the electrically conductive particles continuously.

Furthermore, the convex portion 101 preferably has a top surface flat enough for the electrically conductive particles to be deposited stably.

Specific Example of the Transfer Body

The transfer body to be prepared in the step (i) can be prepared by using a known method. For example, a transfer body can be prepared by processing a metal plate to prepare a master, a curable resin composition is then applied thereto, followed by curing. Specifically, a flat metal plate is cut and processed to prepare a transfer body master formed with a concave portion corresponding to a convex portion. The concave portion forming surface of the master is then coated with a resin composition that configures the transfer body followed by curing. After curing, the composition is separated from the master to obtain a transfer body. The region surrounded by the contour recognizable when the convex portion is viewed in plan view, corresponds to the lattice point region of a planar lattice pattern.

(Step (ii))

Figure 3B:
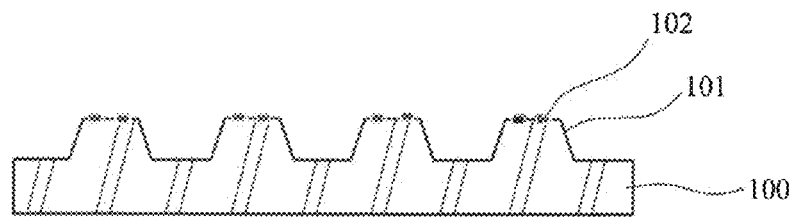
FIG. 3B is a diagram illustrating steps of a production method according to an embodiment of the present invention.

Next, as illustrated in FIG. 3B, at least two slightly adhesive portions 102 are formed on the top surface of the convex portion 101 of the transfer body 100, where a plurality of convex portions 101 are formed in a planar lattice pattern on the surface of the transfer body 100. The shortest distance between the slightly adhesive portions 102 is set preferably to not less than 0.25 times, more preferably not less than 0.5 times the average particle diameter of the applied electrically conductive particle.

Slightly Adhesive Portion of the Transfer Body

The slightly adhesive portion 102 exhibits an adhesive force capable of temporarily holding the electrically conductive particles until the electrically conductive particles are transferred to the electrically insulating adhesive base layer configuring the anisotropic electrically conductive film. Such slightly adhesive portions 102 are formed at least on the top surface of the convex portions 101. Therefore, entire convex portions 101 may possess slight adhesiveness. However, in order to prevent occurrence of unintended aggregation of the electrically conductive particles, two or more slightly adhesive portions 102 separated apart from each other are provided in an embodiment of the present invention. In addition, the thickness of the slightly adhesive portion 102 may be appropriately determined depending on the material of the slightly adhesive portion 102, the particle diameter of the electrically conductive particles, and the like. "Slightly adhesive" means that the adhesive force is weaker than that of the electrically insulating adhesive base layer when the electrically conductive particles are transferred to the electrically insulating adhesive base layer.

As such a slightly adhesive portion 102, a slightly adhesive portion used in a known anisotropic electrically conductive film may be used. For example, the slightly adhesive portion can be formed by applying a silicone-based adhesive composition on the top surface of the convex portions 101.

Not that when producing an anisotropic electrically conductive film having electrically conductive particles regularly arranged as illustrated in FIGS. 2B to 2E, a step may be formed in the concave portions the transfer body master so that the slightly adhesive layer corresponding to the regularly arranged pattern of the electrically conductive particles is formed on the convex portion of the transfer body. Alternatively, the slightly adhesive layer may be formed on the top surface of the convex portion of the transfer body by using a known method such as a screen printing method or a photolithography method.

(Step (iii))

Figure 3C:
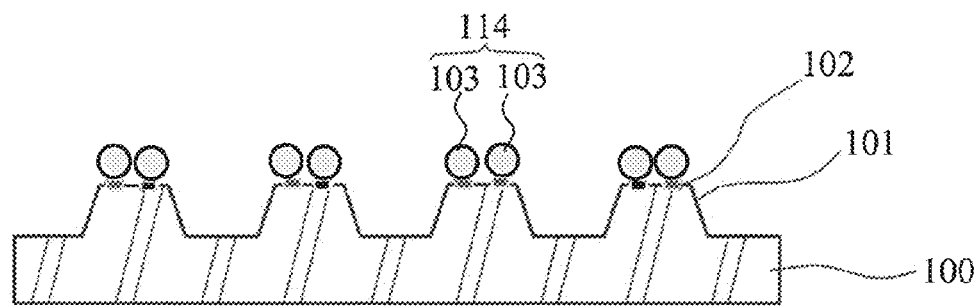
FIG. 3C is a diagram illustrating steps of a production method according to an embodiment of the present invention.

Next, as illustrated in FIG. 3C, electrically conductive particles 103 are deposited to the slightly adhesive portion 102 of the convex portions 101 of the transfer body 100. Specifically, the electrically conductive particles 103 may be dispersed from above on the convex portions 101 of the transfer body 100, and the electrically conductive particles 103 that are not deposited to the slightly adhesive portions 102 may be blown away by using a blower. Thus, a plurality of electrically conductive particles 103 are deposited to a convex portion 101, from which the electrically conductive particle groups 114 are configured.

Note that the direction of the surface may be reversed from FIG. 3C, and the top surface of the protrusion may be contacted to the surface on which the electrically conductive particles are spread all over. This is to avoid unnecessary stress applied to the electrically conductive particles. Thus, by depositing only electrically conductive particles necessary for the arrangement on the top surface of the protrusion, it is easy to recover and reuse electrically conductive particles, which is more economical in comparison with the method of filling the electrically conductive particles in an opening portion and removing later. Note that in the case of the method of filling the electrically conductive particles in an opening portion and removing later, there is a problem that unnecessary stress is easily applied to the unfilled electrically conductive particles.

(Step (iv))

Figure 3D:
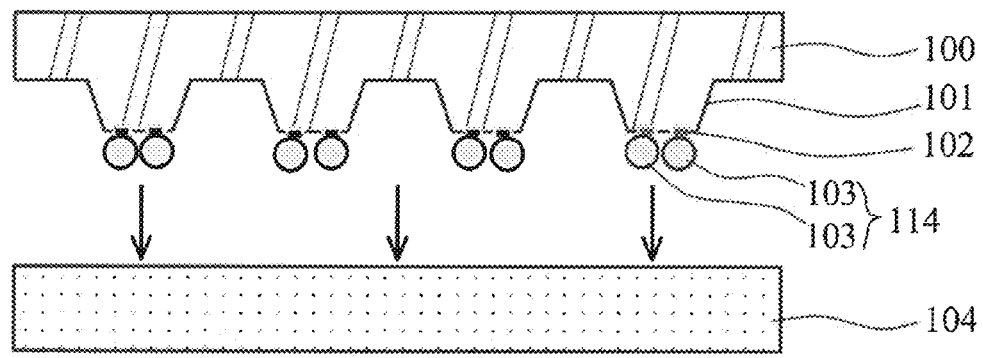
FIG. 3D is a diagram illustrating steps of a production method according to an embodiment of the present invention.
Figure 3E:
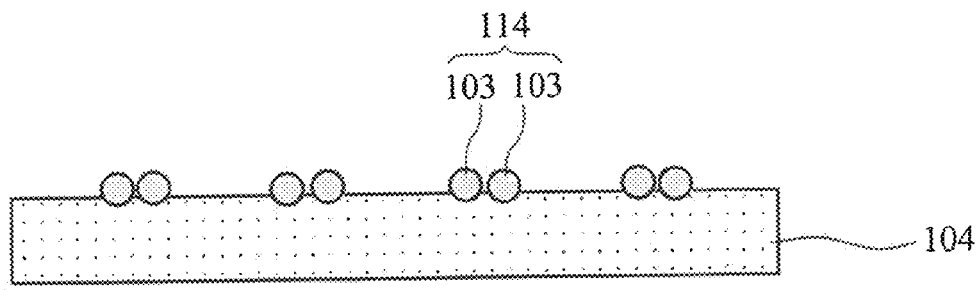
FIG. 3E is a diagram illustrating steps of a production method according to an embodiment of the present invention.

Next, as illustrated in FIG. 3D, when the electrically insulating adhesive base layer 104 constituting the anisotropic electrically conductive film is overlapped and pressed on the surface of the transfer body 100 at a side on which the electrically conductive particle groups 114 are deposited, the electrically conductive particle groups 114 are transferred to one side of the electrically insulating adhesive base layer 104 (FIG. 3E). In this case, it is preferable that the transfer body 100 is overlapped and pressed on the electrically insulating adhesive base layer 104 such that the convex portions 101 face downward. This is because the electrically conductive particles not stuck to the top surface of the convex portion are easily removed by blowing while facing downward. Note that in this step, the transferred electrically conductive particles may be further pressed into the electrically insulating adhesive base layer 11. For example, the transferred electrically conductive particles may further be pressed by the transfer body, or the transferred surface of the electrically conductive particle of the electrically insulating adhesive base layer may be generally pressed by a heat pressing plate. Thereby, the anisotropic electrically conductive film of FIG. 1A, having a structure, in which the electrically conductive particles are disposed on or near the surface of the electrically insulating adhesive base layer, is obtained.

(Step (v))

Figure 3F:
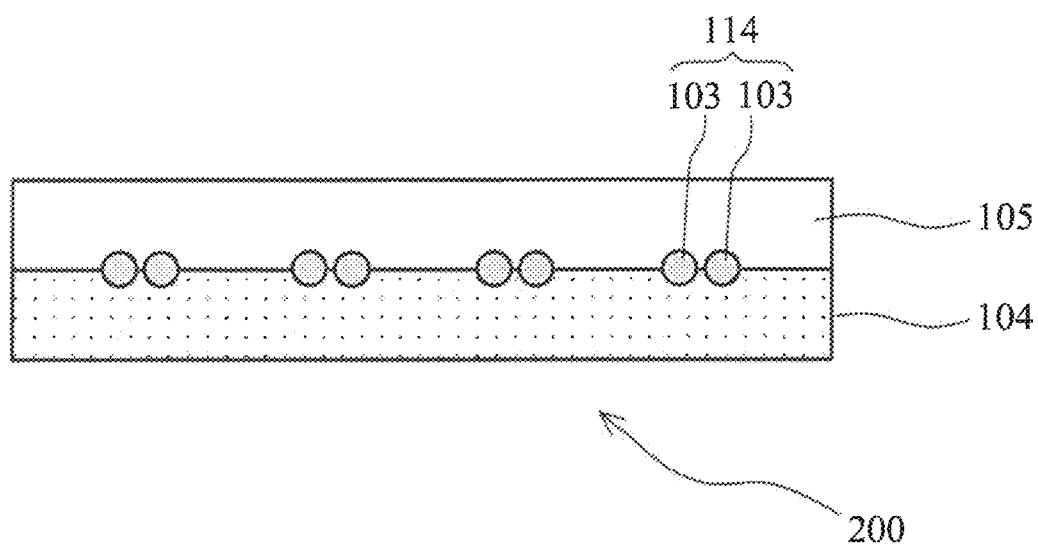
FIG. 3F is a diagram illustrating steps of a production method according to an embodiment of the present invention and a schematic sectional view of the anisotropic electrically conductive film according to an embodiment of the present invention.

Furthermore, as illustrated in FIG. 3F, the electrically insulating adhesive cover layer 105 is laminated on the electrically insulating adhesive base layer 104, on which the electrically conductive particles 103 are transferred, from a side, on which the electrically conductive particles are transferred. Thus, the anisotropic electrically conductive film 200 (FIG. 1B) according to an embodiment of the present invention is obtained.

<Connecting Structure>

The anisotropic electrically conductive film according to an embodiment of the present invention is disposed between the terminal (such as a bump) of the first electronic component (such as an IC chip) and the terminal (such as a bump or a pad) of the second electronic component (such as a wiring board), and then cured by using thermocompression bonding from the first or second electronic component side to anisotropically electrically conductively connect the terminals. Then a connecting structure such as so-called COG (chip on glass), FOG (film on glass), or the like can be obtained, in which short circuit or poor conduction is suppressed.

EXAMPLES

Hereinafter, the present invention will be described in detail.

Example 1

A 2 mm thick nickel plate was prepared. A cylindrically-shaped concave portion (an inner diameter 8 μm and a maximum depth 8 μm) was formed in a tetragonal lattice pattern, and linear grooves having a depth of 1 μm and a width of 1 μm were randomly formed at the bottom (the total area of the grooves was within 70% of the total bottom area). Thus, the transfer body master was obtained. The distance between adjacent concave portions was 12 μm. Accordingly, the density of the concave portions was 2500/mm². The inner diameter of the concave portion and the distance between the adjacent concave portions correspond to a convex portion diameter of the transfer body and the shortest distance between the adjacent convex portions.

The resultant transfer body master was coated with a photopolymerizable resin composition containing 60 parts by mass of phenoxy resin (YP-50, Nippon Steel & Sumikin Chemical Co., Ltd.), 29 parts by mass of acrylate resin (M208, Toagosei Co., Ltd.), and 2 parts by mass of photopolymerization initiator (IRGACURE184, BASF Japan Ltd.) on a PET (polyethylene terephthalate) film to a dried thickness of 30 μm. After drying for five minutes at 80° C., light irradiation at 1000 mJ was performed with a high pressure mercury lamp to create the transfer body.

The transfer body was peeled off from the master and wound around a stainless steel roll having a diameter of 20 cm such that the convex portions were on the outer side. This roll was rotated and simultaneously brought into contact with an adhesive sheet obtained by impregnating a nonwoven fabric with a slightly adhesive composition containing 70 parts by mass of epoxy resin (jER828, Mitsubishi Chemical Corporation) and 30 parts by mass of phenoxy resin (YP-50, Nippon Steel & Sumikin Chemical Co., Ltd.). The slightly adhesive composition was deposited on the top surface of the convex portions to form a 1 μm thick slightly adhesive layer. Thus, the transfer body was obtained.

The slightly adhesive layer was formed in a dot shape due to the grooves provided at the bottom of the transfer body master.

The electrically conductive particles having an average particle diameter of 4 μm (nickel plated resin particles (AUL704, Sekisui Chemical Co., Ltd.)) were dispersed on the surface of the transfer body, and subsequently, blown away to remove the electrically conductive particles, which were not deposited to the slightly adhesive layer.

The transfer body having electrically conductive particles deposited thereon was pressed against a sheet-like thermosetting electrically insulating adhesive film having a thickness of 5 μm that serves as the electrically insulating adhesive base layer (a film formed from an electrically insulating resin composition containing 40 parts by mass of phenoxy resin (YP-50, Nippon Steel & Sumikin Chemical Co., Ltd.), 40 parts by mass of epoxy resin (jER828, Mitsubishi Chemical Corporation), 2 parts by mass of cationic curing agent (SI-60L, Sanshin Chemical Industry Co., Ltd.), and 20 parts by mass of silica fine particles filler (Aerosil RY200, Nippon Aerosil Co., Ltd.)). The transfer body was pressed at a temperature of 50° C. and a pressure of 0.5 MPa from the side on which electrically conductive particles were deposited. Thus, the electrically conductive particles were transferred to the electrically insulating adhesive base layer.

On the surface of the resulting electrically insulating adhesive base layer, on which the electrically conductive particles were deposited, another sheet-like electrically insulating adhesive film having a thickness of 15 μm (a film formed from a thermosetting resin composition containing 60 parts by mass of phenoxy resin (YP-50, Nippon Steel & Sumikin Chemical Co., Ltd.), 40 parts by mass of epoxy resin (jER828, Mitsubishi Chemical Corporation), and 2 parts by mass of cationic curing agent (SI-60L, Sanshin Chemical Industry Co., Ltd.)) was overlapped as a transparent electrically insulating adhesive cover layer and laminated together at a temperature of 60° C. and a pressure of 2 MPa. Thereby, the anisotropic electrically conductive film was obtained.

Example 2

The anisotropic electrically conductive film was obtained by repeating the Example 1 except for changing the distance between the adjacent concave portions to 8 μm when preparing the transfer body master. Note that the density of the concave portions of the transfer body master was 3900/mm².

Example 3

The anisotropic electrically conductive film was obtained by repeating the Example 1 except for changing the inner diameter of the concave portion to 12 μm and the distance between the adjacent concave portions to 8 μm when preparing the transfer body master. Note that the density of the concave portions of the transfer body master was 2500/mm².

Example 4

The anisotropic electrically conductive film was obtained by repeating the Example 1 except for changing the inner diameter of the concave portion to 20 μm and the distance between the adjacent concave portions to 20 μm when preparing the transfer body master was. Note that the density of the concave portions of the transfer body master was 625/mm².

Comparative Example 1

The anisotropic electrically conductive film was obtained by repeating the Example 1 except for changing the inner diameter of the concave portion to 12 μm and the distance between the adjacent concave portions to 4 μm when preparing the transfer body master. Note that the density of the concave portions of the transfer body master was 3900/mm².

Comparative Example 2

The anisotropic electrically conductive film was obtained by repeating the Example 2 except that in the Example 2, a dispersion and blowing treatment for electrically conductive particles was performed twice.

Comparative Example 3

The anisotropic electrically conductive film was obtained by repeating the Example 1 except for changing the inner diameter of the concave portion to 8 μm and the distance between the adjacent concave portions to 80 μm when preparing the transfer body master. The density of concave portions was 130/mm².

<Evaluation>
(Evaluation Related to Lattice Point Region)

The shortest distance between the adjacent electrically conductive particles in the (circular) lattice point region, the shortest distance between the adjacent lattice point regions, and the diameter of the lattice point region, of the anisotropic electrically conductive films in the Examples and Comparative Examples were measured by using an optical microscope (MX50, Olympus Co., Ltd.). The obtained results are shown in Table 1.

(Number of Adjacent Electrically Conductive Particles)

One hundred electrically conductive particles of the anisotropic electrically conductive films of the Examples and Comparative Examples were arbitrarily selected. When each electrically conductive particle is assumed to be a sphere, the number of electrically conductive particles at least partially overlapping a concentric circle having a radius of 2.5 r in the horizontal direction, where r denotes the average particle diameter thereof, was measured by using an optical microscope (MX50, Olympus Co., Ltd.). The obtained results (minimum number (MIN) and maximum number (MAX)) are shown in Table 1. Practically, the number is preferably not more than 10.

Note that the measurement observation showed that in the Comparative Example 2 the electrically conductive particles were in a dense state because the dispersion and blowing treatment was repeated twice. This was also understood from the fact that the number of adjacent electrically conductive particles increased.

(Initial Conductivity (Initial Conduction Resistance))

The anisotropic electrically conductive films of the Examples and the Comparative Examples were used to form an anisotropic electrically conductive connection between the IC chip having a gold bump with a spacing between bumps of 12 μm, height of 15 μm, and a diameter of 30×50 m and a glass substrate provided with a wiring of 12 μm spacing, under conditions of 180° C., 60 MPa, and 5 seconds, to obtain a connecting structure. For the resulting connecting structure, an initial conduction resistance value was measured by using a resistance measuring instrument (digital multimeter, Yokogawa Electric Corporation). The obtained results are shown in Table 1. The resistance of not greater than 1Ω is desirable.

(Conduction Reliability)

The connecting structure used for measuring of the initial conduction resistance value was placed in an aging tester set to a temperature of 85° C. and a humidity of 85%, and the conduction resistance value after 500 hours of standing was measured in the same manner as the initial conduction resistance. The obtained results are shown in Table 1. The resistance of not greater than 5Ω is desirable.

(Occurrence Rate of Short Circuit)

The same connecting structure as used for the initial conduction resistance was prepared to check the presence or absence of occurrence of a short circuit between the adjacent wirings. The obtained results are shown in Table 1. The occurrence rate of short circuit of not greater than 50 ppm is desirable.

TABLE 1

| | | Examples | | | | Comparative Examples | | |
|---|---|---|---|---|---|---|---|---|
| | | 1 | 2 | 3 | 4 | 1 | 2 | 3 |
| Average Particle Diameter of Electrically conductive Particles | [μm] | 4 | 4 | 4 | 4 | 4 | 4 | 4 |
| Shortest Distance Between Adjacent Electrically conductive Particles | [μm] | 2 | 1 | 2 | 2 | 2 | 0 | 1 |
| Diameter of Lattice Point Region | [μm] | 8 | 8 | 12 | 20 | 12 | 8 | 8 |
| Shortest Distance Between Adjacent Lattice Point Regions | [μm] | 12 | 8 | 8 | 20 | 4 | 8 | 80 |
| Number of Adjacent Electrically conductive Particles | MIN | 1 | 1 | 2 | 2 | 5 | 7 | 0 |
| | MAX | 4 | 6 | 8 | 10 | 12 | 15 | 4 |
| Initial Conduction Resistance | [Ω] | 0.2 | 0.2 | 0.2 | 0.2 | 0.2 | 0.2 | 1 |
| Conduction Reliability | [Ω] | 4 | 4 | 4 | 4 | 4 | 4 | 15 |
| Occurrence Rate of Short Circuit | [ppm] | <50 | <50 | <50 | <50 | 200 | 500 | <50 |

As is clear from the results in Table 1 that the connecting structure using the anisotropic electrically conductive films of Examples 1 to 4 showed satisfactory results for each of the evaluation items of initial conductivity (initial conduction resistance), conduction reliability, and occurrence rate of short circuit.

On the other hand, in the anisotropic electrically conductive films of the Comparative Examples 1 and 2, there were many adjacent electrically conductive particles in plan view; thus the occurrence rate of short circuit was unfavorably very high compared to the Examples. In the anisotropic electrically conductive film of the Comparative Example 3, the number of electrically conductive particles was too sparse, thus the conduction reliability was insufficient, and the initial conductivity was also inferior compared to the Examples.

Example 5

The electrically insulating adhesive base layer was prepared in the same manner as in the Example 1 except that phenoxy resin (YP-50, Nippon Steel & Sumikin Chemical Co., Ltd.) was changed from 40 to 50 parts by mass, silica fine particle filler (Aerosil RY200, Nippon Aerosil Co., Ltd.) was changed from 20 to 10 parts by mass, and the thickness was changed from 5 μm to 20 μm from Example 1 without using the electrically insulating adhesive cover layer. Then, the electrically conductive particles were transferred and pressed to obtain an anisotropic electrically conductive film, in which the electrically conductive particles were disposed in the electrically insulating adhesive base layer, as illustrated in FIG. 1A. As in the case of Example 1, the connecting structure using this anisotropic electrically conductive film showed satisfactory results for each of the evaluation items of initial conductivity (initial conduction resistance), conduction reliability, and occurrence rate of short circuit.

Example 6

In order to produce the anisotropic electrically conductive film having electrically conductive particles regularly arranged as illustrated in FIG. 2B, the anisotropic electrically conductive film was obtained in the same manner as in Example 1 except for using the transfer body master having a concave portion (size 14 μm×14 μm (a step was provided at each corner of the concave portion so that the slightly adhesive layer was provided only at each corresponding corner of the transfer body)), a concave portion density of 125/mm$^2$, and a distance between the adjacent concave portions of 75 μm; providing the slightly adhesive layer at the corner of the top surface of the convex portion of the transfer body so that the number of electrically conductive particles in the electrically conductive particle group was four and the distance between the electrically conductive particles in the electrically conductive particle group was 4 μm; changing the amount of the phenoxy resin (YP-50, Nippon Steel & Sumikin Chemical Co., Ltd.) and the silica fine particle filler (Aerosil RY200, Nippon Aerosil Co., Ltd.) of the electrically insulating adhesive base layer of Example 1 from 40 parts by mass to 50 parts by mass and from 20 parts by mass to 10 parts by mass, respectively. The density of number of electrically conductive particles was 500/mm$^2$.

In addition, the resulting anisotropic electrically conductive film was interposed between a glass substrate (ITO solid electrode) and a flexible wiring board (bump width: 200 μm, L (line)/S, wiring height of 10 μm) to establish an anisotropic conduction connection under the conditions of 180° C., 5 MPa-5 seconds so that the connecting bump length was 1 mm, and thus, the connecting structure for evaluation was obtained. For the resulting connecting structure, the "initial conduction resistance value", and the "conduction reliability" after being placed in a thermostatic chamber with a temperature of 85° C. and a humidity of 85% RH for 500 hours were evaluated as follows: the conduction resistance was measured using a four terminal method at a current of 1 A using a digital multimeter (34401A, manufactured by Agilent Technologies, Inc.), the "initial conductivity" was evaluated as satisfactory when the measured value was not greater than 2Ω and evaluated as poor when the measured value exceeds 2Ω, and the "conduction reliability" was evaluated as satisfactory when the measured value was not greater than 5Ω and evaluated as poor when the measured value was not less than 5Ω. As a result, all the connecting structures of the present Examples were evaluated as "satisfactory". In addition, the "occurrence rate of short circuit" was measured in the same manner as in Example 1, and satisfactory results similar to Example 1 were obtained.

Example 7

The anisotropic electrically conductive film was obtained in the same manner as in Example 6 except for using the transfer body master having the concave portion density of 500/mm$^2$ and the distance of 31 μm between the adjacent concave portions so that the density of number of electrically conductive particles was 2000/mm$^2$.

In addition, the resulting anisotropic electrically conductive film was interposed between a glass substrate and a flexible wiring board in the same manner as in Example 6 to establish an anisotropic conduction connection to obtain a connecting structure for evaluation. The resulting connecting structure was evaluated for "initial conductivity", "conduction reliability", and "occurrence rate of short circuit" in the same manner as in Example 6, and all were found to satisfactory.

Example 8

In order to produce the anisotropic electrically conductive film having electrically conductive particles regularly arranged as illustrated in FIG. 2C, the transfer body master having a concave portion size of 20 μm×20 μm (a step was provided in the concave portion so that the slightly adhesive layer was provided only at the predetermined places of the transfer body), a concave portion density of 125/mm$^2$, and the distance between the adjacent centers of 69 μm, was used. The number of electrically conductive particles of electrically conductive particle group was continuously changed to 6, 5, 4, and 3, and the shortest distance between electrically conductive particles in the electrically conductive particle groups was set to not less than 3 μm in any shape. Note that, the outer shapes are set to be approximately equal for any shape. Furthermore, such a shape is one resembling a regular hexagon, a regular pentagon, a square, or a regular triangle, by adjusting the length of either side of the shape accordingly. The anisotropic electrically conductive film was obtained in the same manner as in Example 6, except providing the slightly adhesive layer on the top surface of the convex portion of the transfer body. The density of number of electrically conductive particles was 500/mm$^2$.

In addition, the resulting anisotropic electrically conductive film was interposed between a glass substrate and a flexible wiring board in the same manner as in Example 6 to establish an anisotropic conduction connection to obtain a connecting structure for evaluation. The resulting connecting structure was evaluated for "initial conductivity", "conduction reliability", and "occurrence rate of short circuit" in the same manner as in the Example 6, and all were found to be satisfactory.

Example 9

The anisotropic electrically conductive film was obtained in the same manner as in Example 8, except for using the transfer body master having a concave portion density of 500/mm$^2$ and a distance between the adjacent concave portions of 25 μm so that the density of number of the electrically conductive particles was 2000/mm$^2$.

In addition, the resulting anisotropic electrically conductive film was interposed between a glass substrate and a flexible wiring board in the same manner as in Example 6 to establish an anisotropic conduction connection to obtain a connecting structure for evaluation. The resulting connecting structure was evaluated for "initial conductivity", "conduction reliability", and "occurrence rate of short circuit" in the same manner as in Example 5, and all were found to be satisfactory.

Example 10

In order to produce the anisotropic electrically conductive film having electrically conductive particles regularly arranged as illustrated in FIG. 2D, the anisotropic electrically conductive film was obtained in the same manner as in Example 6, except for using the transfer body master having a concave portion size of 20 µm×20 µm (a step was provided in the concave portion so that the slightly adhesive layer was provided only at a predetermined location of the transfer body), a concave portion density of 167/mm², and a distance between the adjacent concave portions of 57 µm; providing the slightly adhesive layer on the top surface of the convex portion of the transfer body so that the number of electrically conductive particles in the electrically conductive particle group was three, and the shape of the electrically conductive particle group was an isosceles triangle, and the distance between the electrically conductive particles was (4 µm, 12 µm, and 12 µm), or (8 µm, 13 µm, and 13 µm). The density of number of the electrically conductive particles was 500/mm².

In addition, the resulting anisotropic electrically conductive film was interposed between a glass substrate and a flexible wiring board in the same manner as in Example 6 to establish an anisotropic conduction connection to obtain a connecting structure for evaluation. The resulting connecting structure was evaluated for "initial conductivity", "conduction reliability", and "occurrence rate of short circuit" in the same manner as in Example 6, and all were found to satisfactory.

Example 11

The anisotropic electrically conductive film was obtained in the same manner as in Example 10, except for using the transfer body master having the concave portion density of 667/mm² and the distance between the adjacent concave portions of 19 µm so that the density of number of electrically conductive particles was 2000/mm².

In addition, the resulting anisotropic electrically conductive film was interposed between a glass substrate and a flexible wiring board in the same manner as in Example 6 to establish an anisotropic conduction connection to obtain a connecting structure for evaluation. The resulting connecting structure was evaluated for "initial conductivity", "conduction reliability", and "occurrence rate of short circuit" in the same manner as in the Example 6, and all were found to be satisfactory.

Example 12

In order to produce the anisotropic electrically conductive film having electrically conductive particles regularly arranged as illustrated in FIG. 2E, the anisotropic electrically conductive film was obtained in the same manner as in Example 6, except for using the transfer body master with the rectangular electrically conductive particle groups, the inclination of which was incrementally increased by 15 degrees in the longitudinal direction and the short-side direction of the film, respectively. The density of number of electrically conductive particle was 500/mm².

In addition, the resulting anisotropic electrically conductive film was interposed between a glass substrate and a flexible wiring board in the same manner as in Example 6 to establish an anisotropic conduction connection to obtain a connecting structure for evaluation. The resulting connecting structure was evaluated for "initial conductivity", "conduction reliability", and "occurrence rate of short circuit" in the same manner as in the Example 6, and all were found to be satisfactory.

Example 13

The anisotropic electrically conductive film was obtained in the same manner as in Example 12, except for using the transfer body master having a concave portion density of 500/mm², and the distance between the adjacent concave portions of 31 µm so that the density of number of electrically conductive particles was 2000/mm².

In addition, the resulting anisotropic electrically conductive film was interposed between a glass substrate and a flexible wiring board in the same manner as in Example 6 to establish an anisotropic conduction connection to obtain a connecting structure for evaluation. The resulting connecting structure was evaluated for "initial conductivity", "conduction reliability", and "occurrence rate of short circuit" in the same manner as in Example 5, and all were found to be satisfactory.

Note that, in Examples 6 to 13, another anisotropic electrically conductive film was prepared and evaluated by repeating the respective Examples except that the method was employed, in which electrically conductive particles were filled directly into a transfer mold having a concave portion and the electrically conductive particles were transferred to the electrically insulating adhesive base layer. As a result, substantially the same results as in Examples 6 to 13 were obtained.

INDUSTRIAL APPLICABILITY

For the anisotropic electrically conductive film according to an embodiment of the present invention, the following is employed: a transfer body having a convex portion corresponding to a lattice point region of a planar lattice pattern, formed on the surface thereof, is used; two or more slightly adhesive portions are formed on the top surface of the convex portion; the electrically conductive particles are deposited on the slightly adhesive portions; and then the electrically conductive particles are transferred to an electrically insulating adhesive base layer. Therefore, the electrically conductive particle groups configured from two or more electrically conductive particles are disposed in a lattice point region of a planar lattice pattern. Therefore, use of anisotropic electrically conductive film obtained by the production method according to an embodiment of the present invention can achieve anisotropic electrically conductive connection while significantly suppressing occurrences of short circuit and poor conduction between the IC chip and the wiring board having narrow pitches.

REFERENCE SIGNS LIST

10, 200 Anisotropic electrically conductive film
11, 104 Electrically insulating adhesive base layer
12, 105 Electrically insulating adhesive cover layer
13, 103 Electrically conductive particle
14,114 Electrically conductive particle group
15 Lattice point region of a planar lattice pattern
100 Transfer body
101 Convex portion
102 Slightly adhesive portion
P Lattice point

The invention claimed is:

1. A method of producing an anisotropic electrically conductive film having a structure, in which electrically conductive particles are disposed on or near a surface of an electrically insulating adhesive base layer, wherein an electrically conductive particle group is configured from two or more electrically conductive particles, and the electrically conductive particle group is disposed in a lattice point region of a planar lattice pattern, the method comprising the following steps (i) to (iv):

step (i)
preparing a transfer body having a convex portion corresponding to a lattice point region of a planar lattice pattern, formed on a surface thereof;

step (ii)
forming two or more slightly adhesive portions on a top surface of the convex portion of the transfer body;

step (iii)
depositing electrically conductive particles on the slightly adhesive portions of the convex portion of the transfer body; and step (iv)
transferring the electrically conductive particles to an electrically insulating adhesive base layer by overlapping and pressing the electrically insulating adhesive base layer on the surface at a side of the transfer body on which the electrically conductive particles are deposited.

2. The method according to claim 1, wherein an electrically insulating adhesive cover layer is laminated on the electrically insulating adhesive base layer and the electrically conductive particles are disposed near an interface therebetween, wherein
the method further comprises the following step (v):
step (v)
laminating an electrically insulating adhesive cover layer to the electrically insulating adhesive base layer, on which the electrically conductive particles are transferred, from a side, on which the electrically conductive particles are transferred.

3. The method according to claim 1, wherein the transfer body used in step (i) is prepared by processing a metal plate to prepare a master, followed by coating a curable resin composition on the master, and curing the curable resin composition.

4. The method according to claim 1, wherein a height of the convex portion of the transfer body in step (i) is not less than 1.2 times and less than four times an average particle diameter of the electrically conductive particles, and a full width at the half height of the convex portion is not less than two times and not greater than seven times the average particle diameter of the electrically conductive particles.

5. An anisotropic electrically conductive film having a structure, in which electrically conductive particles are disposed on or near the surface of an electrically insulating adhesive base layer, wherein
electrically conductive particle groups are configured from three or more electrically conductive particles, and
the electrically conductive particle groups are disposed in a lattice point region of a planar lattice pattern and the electrically conductive particles are regularly disposed within the electrically conductive particle group.

6. The anisotropic electrically conductive film according to claim 5, wherein an electrically insulating adhesive cover layer is laminated on the electrically insulating adhesive base layer.

7. The anisotropic electrically conductive film according to claim 5, wherein two or more sides of a polygonal shape including electrically conductive particles in the electrically conductive particle group are not parallel to the longitudinal direction of the film and the direction orthogonal thereto.

8. The anisotropic electrically conductive film according to claim 6, wherein two or more sides of a polygonal shape including electrically conductive particles in the electrically conductive particle group are not parallel to the longitudinal direction of the film and the direction orthogonal thereto.

9. The anisotropic electrically conductive film according to claim 5, wherein the number of electrically conductive particles within the electrically conductive particle group regularly changes for each electrically conductive particle group.

10. The anisotropic electrically conductive film according to claim 6, wherein the number of electrically conductive particles within the electrically conductive particle group regularly changes for each electrically conductive particle group.

11. The anisotropic electrically conductive film according to claim 5, wherein a distance between the electrically conductive particles within the electrically conductive particle group regularly changes for each electrically conductive particle group.

12. The anisotropic electrically conductive film according to claim 6, wherein a distance between the electrically conductive particles within the electrically conductive particle group regularly changes for each electrically conductive particle group.

13. The anisotropic electrically conductive film according to claim 5, wherein an angle of a polygonal shape including electrically conductive particles in the electrically conductive particle group relative to the longitudinal direction of the film regularly changes.

14. The anisotropic electrically conductive film according to claim 6, wherein an angle of a polygonal shape including electrically conductive particles in the electrically conductive particle group relative to the longitudinal direction of the film regularly changes.

15. The anisotropic electrically conductive film according to claim 5, wherein the electrically insulating adhesive base layer contains an electrically insulating filler.

16. The anisotropic electrically conductive film according to claim 6, wherein at least one of the electrically insulating adhesive base layer and the electrically insulating adhesive cover layer contains an electrically insulating filler.

17. A connecting structure having a terminal of a first electronic component and a terminal of a second electronic component being anisotropically electrically conductively connected by the anisotropic electrically conductive film described in claim 5.

18. A connecting structure having a terminal of a first electronic component and a terminal of a second electronic component being anisotropically electrically conductively connected by the anisotropic electrically conductive film described in claim 6.

* * * * *